United States Patent [19]
Chritz

[11] Patent Number: 6,052,304
[45] Date of Patent: Apr. 18, 2000

[54] NON-VOLATILE STORAGE ELEMENT AND METHOD FOR MANUFACTURING USING STANDARD PROCESSING

[75] Inventor: Jeffery B. Chritz, Vancouver, Wash.

[73] Assignee: LSI Logic Corporation, Milpitas, Calif.

[21] Appl. No.: 09/099,574

[22] Filed: Jun. 18, 1998

[51] Int. Cl.[7] .................................................. G11C 14/00
[52] U.S. Cl. ............... 365/185.08; 365/150; 365/185.26; 365/185.33
[58] Field of Search .................. 365/185.08, 185.07, 365/150, 185.26, 185.3, 185.33, 149

[56] References Cited

U.S. PATENT DOCUMENTS

| | | | |
|---|---|---|---|
| 4,326,134 | 4/1982 | Owen et al. | 327/170 |
| 5,587,951 | 12/1996 | Jazayeri et al. | 365/203 |
| 5,768,208 | 6/1998 | Bruwer et al. | 365/228 |
| 5,812,463 | 9/1998 | Park | 365/189.05 |
| 5,864,499 | 1/1999 | Roohparvar et al. | 365/185.08 |

Primary Examiner—David Nelms
Assistant Examiner—Gene N. Auduong

[57] ABSTRACT

Disclosed is a non-volatile storage element that is defined between a bitline and a complementary bitline, and that can be accessed by a selected wordline is disclosed. The non-volatile storage element includes a high voltage latch that is configured to receive a pump voltage, and a reference voltage that is about half of the pump voltage. The non-volatile storage element also includes a storage cell that is configured to receive a logical programming value from the bitline and the complementary bit line when the wordline is driven high to turn on a first passgate and a second passgate. The storage cell further includes a capacitive transistor having its back gate, source and drain connected to a first terminal of the first passgate, and a tunneling transistor having its back gate, source and drain connected to a second terminal of the second passgate. The capacitive transistor and the tunneling transistor are configured to share a floating gate. When one or more of the above described non-volatile storage elements are defined in a custom application specific integrated circuit (ASIC) having a multiplicity of transistors, each of the transistors in the storage element may be formed using about the same fabrication process operations as used to fabricate the multiplicity of transistors of the ASIC.

26 Claims, 6 Drawing Sheets

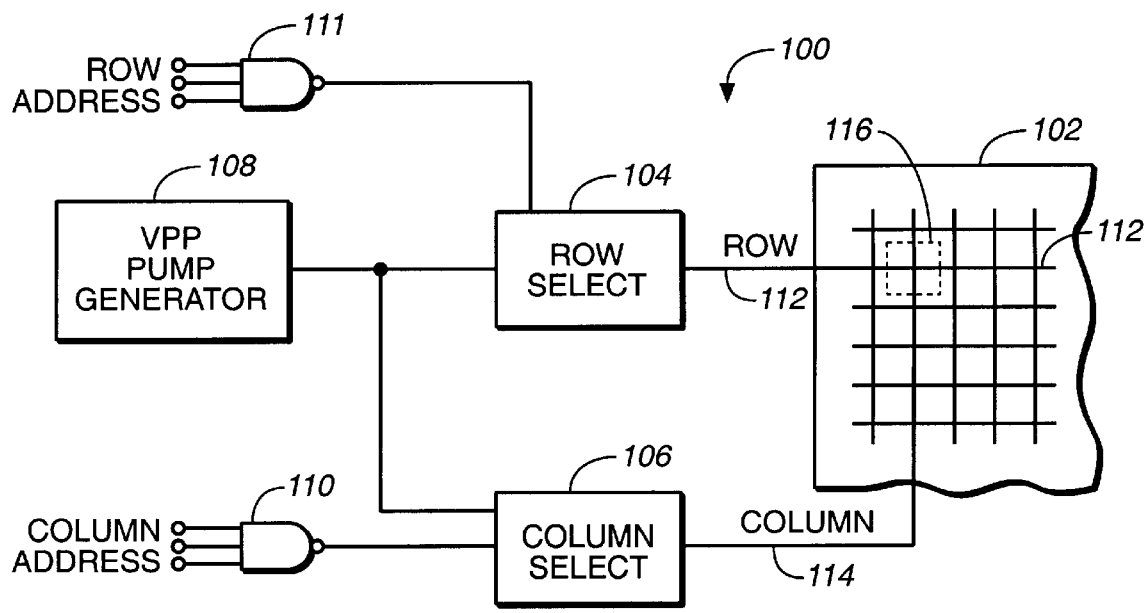
FIG._1A
(PRIOR ART)
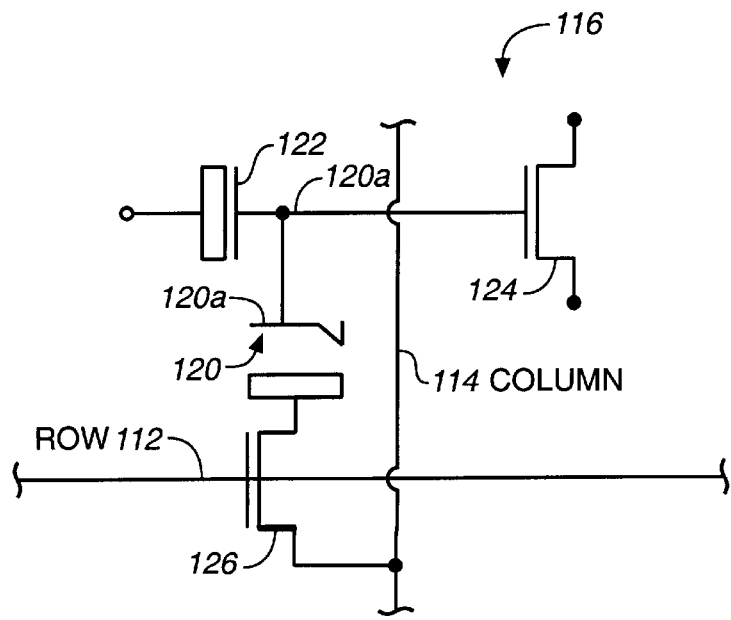
FIG._1B
(PRIOR ART)

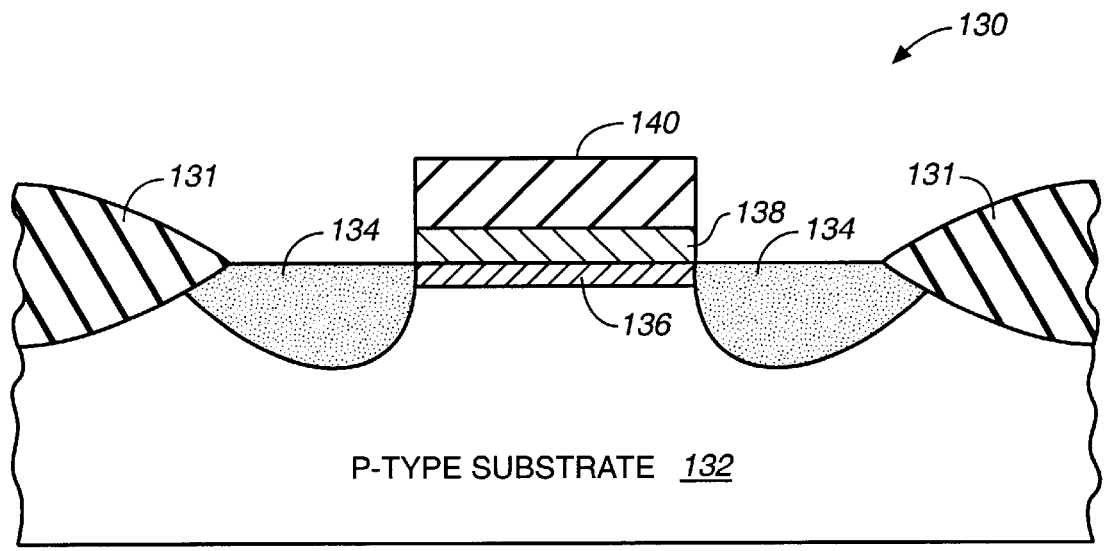
FIG._1C
(PRIOR ART)
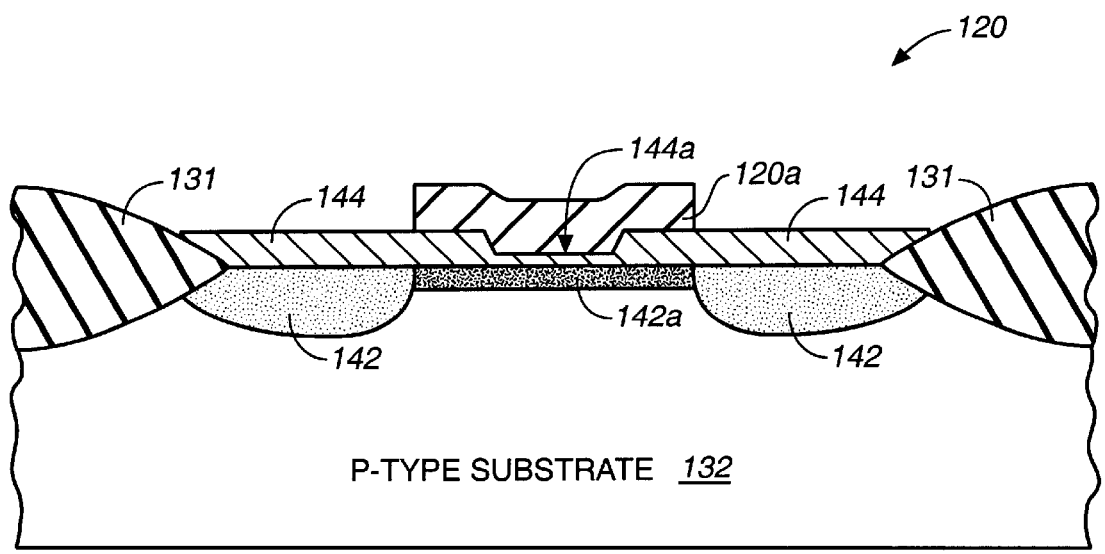
FIG._1D
(PRIOR ART)

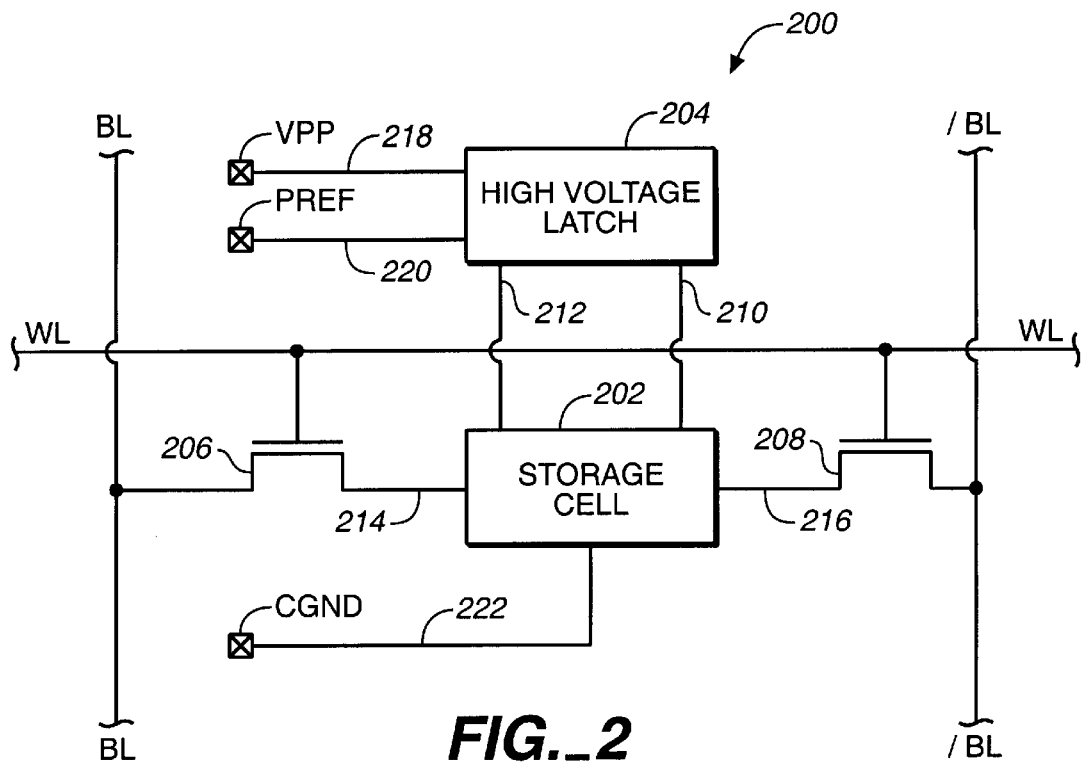
FIG._2
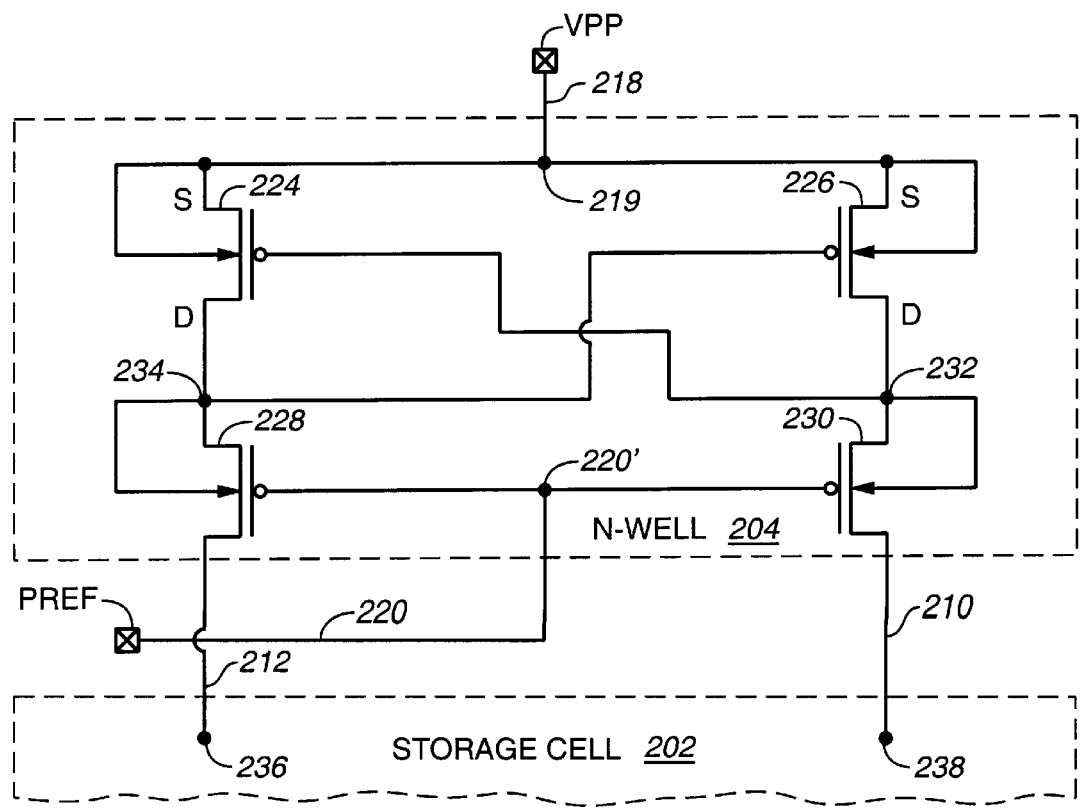
FIG._3A

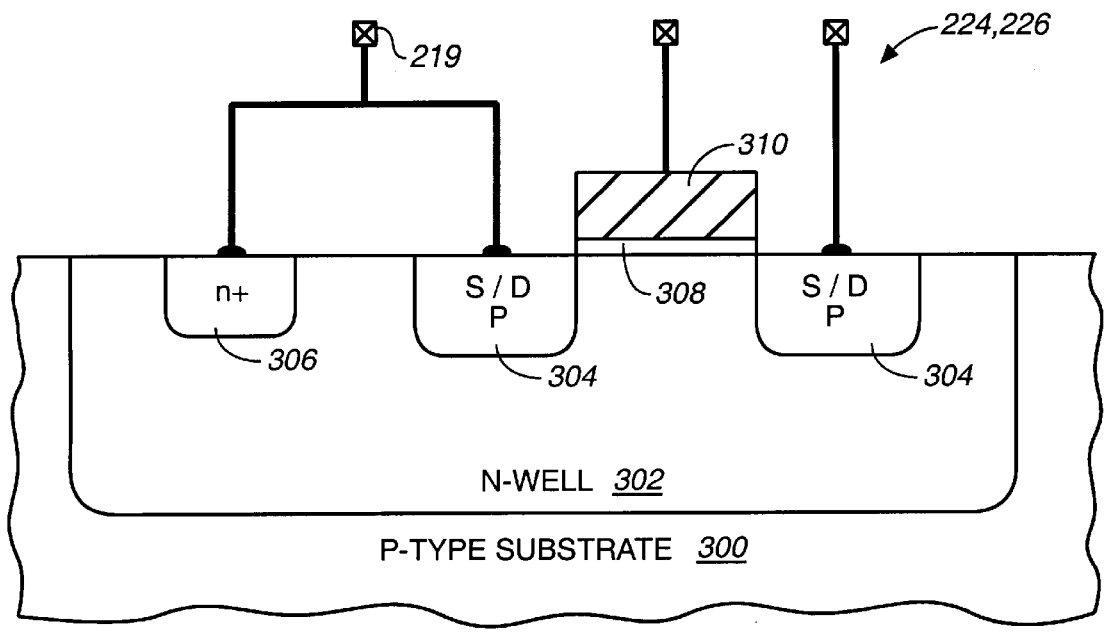
FIG._3B
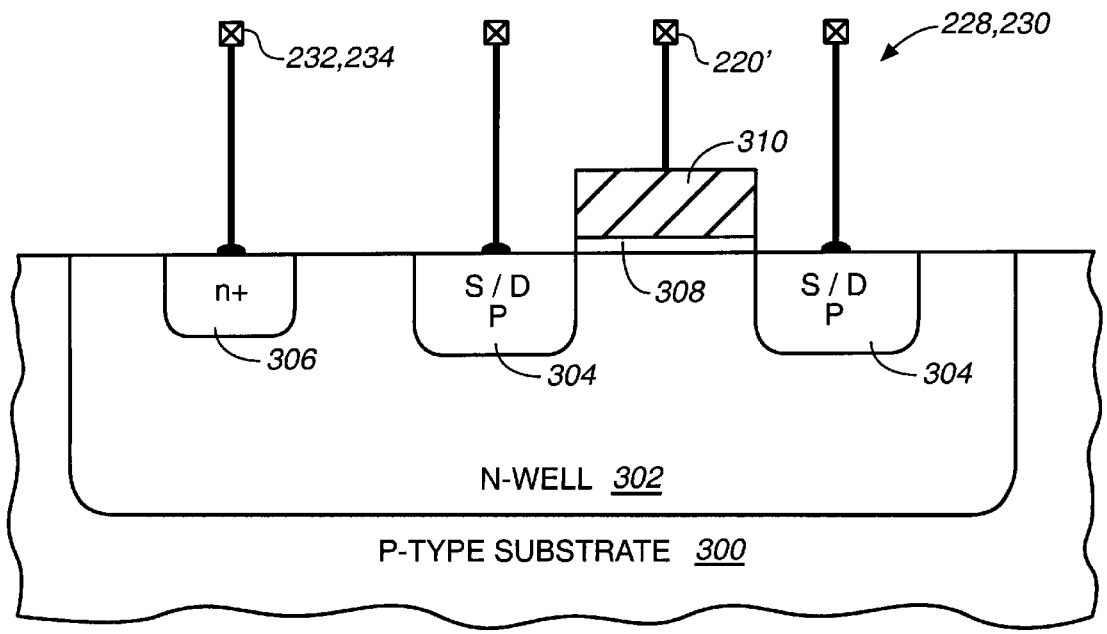
FIG._3C

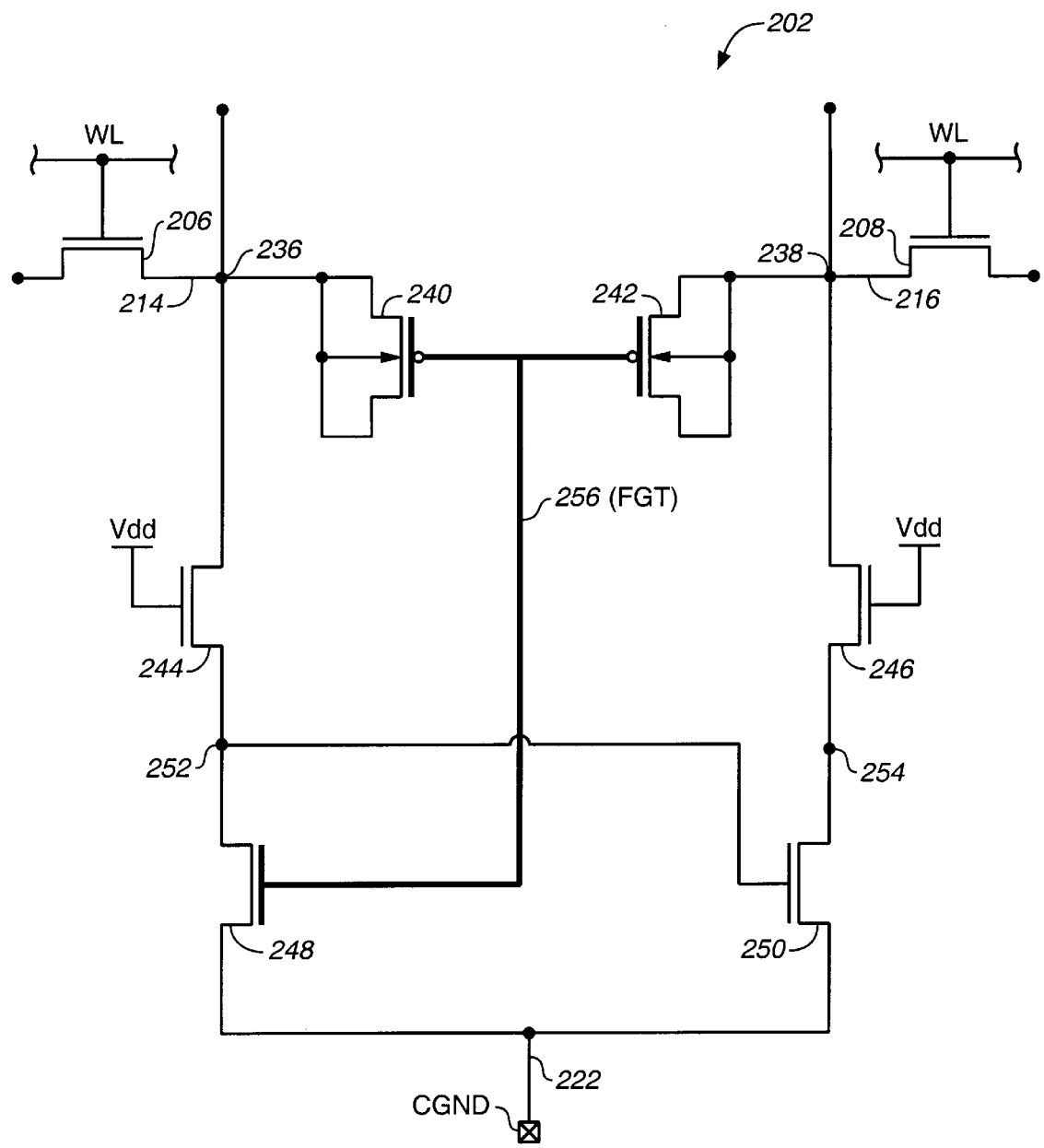
FIG._4A

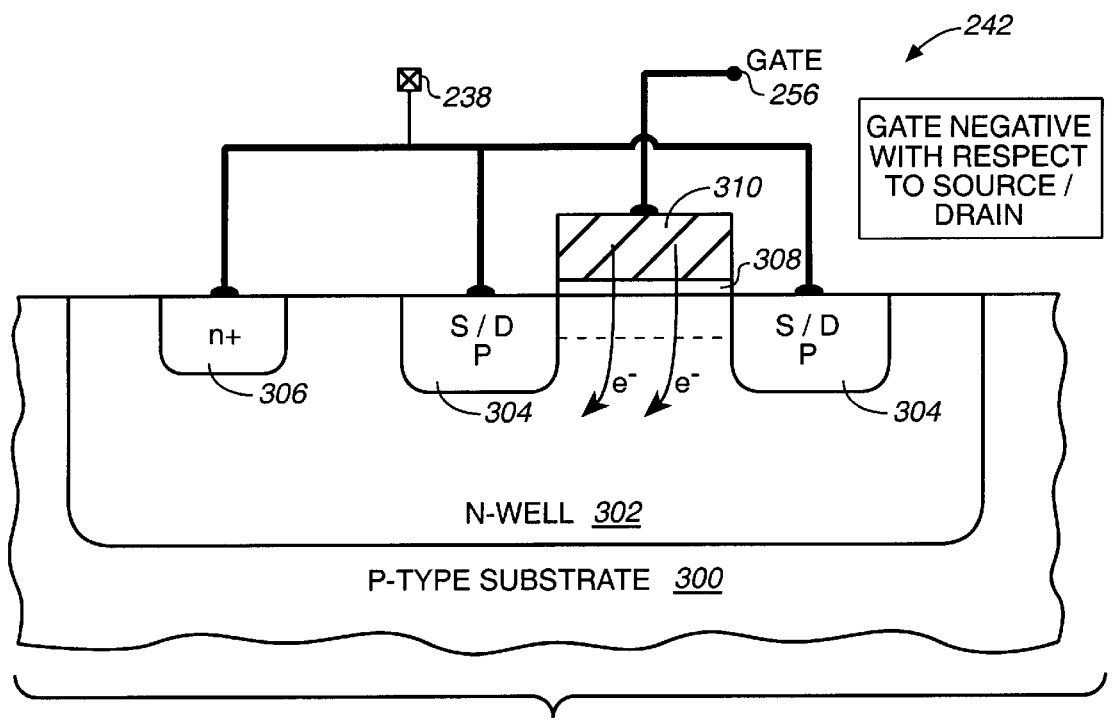
FIG._4B
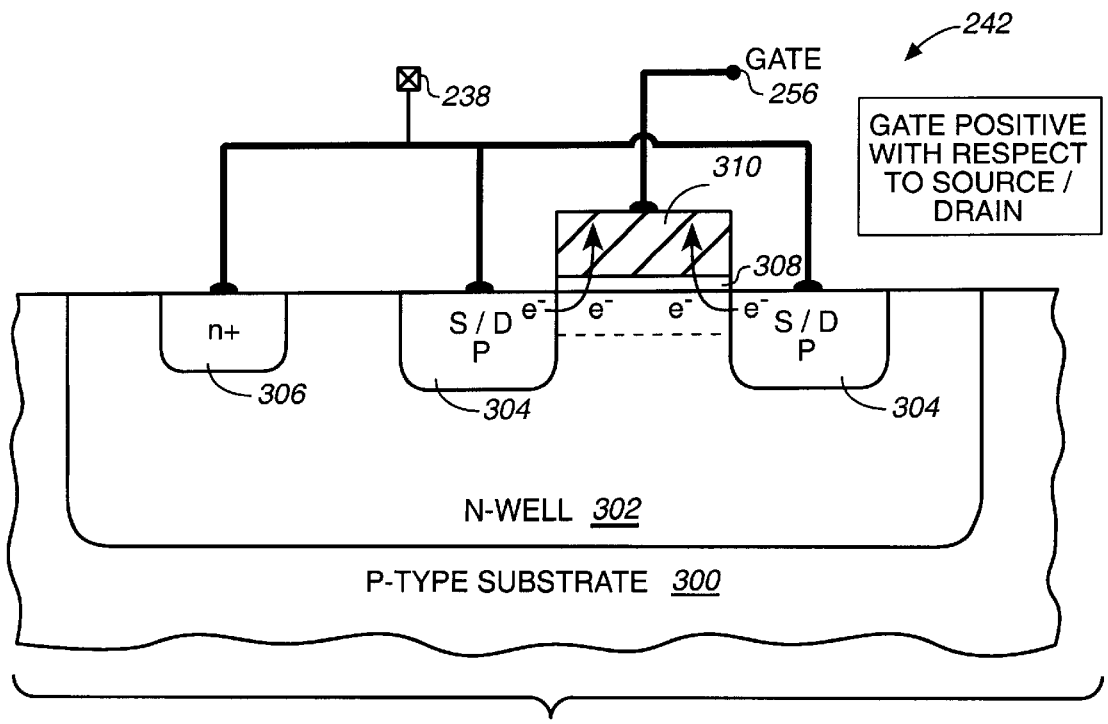
FIG._4C

NON-VOLATILE STORAGE ELEMENT AND METHOD FOR MANUFACTURING USING STANDARD PROCESSING

BACKGROUND OF THE INVENTION

1. Field of the Invention

The present invention relates generally to integrated circuits, and more particularly, to integrated circuit memory devices fabricated using standard processing techniques used to fabricate core circuitry transistor devices.

2. Description of the Related Art

In the design of integrated circuit devices, there is often a need to integrate some sort of non-volatile memory storage elements among other logic processing transistors. In today's integrated circuit implementations, non-volatile memory storage elements are being used to achieve functional customization (e.g., as in FPGAs), or store codes for tracking purposes and store security/authorization codes to prevent pirating of information or services. However, the integration of only a few storage elements in selected application specific integrated circuits (ASICs) incurs the additional cost of complicating the semiconductor processing operations implemented to make the ASIC. For example, when a non-volatile memory storage element is fabricated along with standard transistors that are implemented in the ASIC design, many more processing operations will be required in order to fabricate special high voltage transistors and tunneling transistors that that are needed to make the non-volatile memory storage devices. As will be described below, the additional fabrication is needed because the junctions and gate oxides of normal ASCI transistors are not able to withstand the high voltages needed to program the memory cells.

Traditionally, non-volatile memory storage elements are arranged as arrays of cells that can be written to and read from by accessing selected rows and columns. FIG. 1A shows an example of a non-volatile storage memory 100 (and access circuitry), including a memory array 102 having a plurality of rows and columns. For simplicity, the intersection of a row 112 and a column 114 will define the location of a selected cell 116. The memory access circuitry typically includes a row select unit 104 that enables access to a specific row 112 of the memory array 102, and a column select unit 106 that enables selective access to a particular column 114 of the memory array 102.

In typical designs, a Vpp programming voltage pump generator 108 is provided in electrical communication with the row select 104 and the column select 106. The Vpp pump generator 108 is configured to provide a high voltage typically in the range of about 12–14 volts to both the row select 104 and the column select 106 during a programming operation. The row select unit 104 typically includes a number of high voltage transistors which enable the generation and steering of a high voltage onto the selected row, which is greater than Vpp by a voltage threshold Vtn, for an N-type transistor (i.e., Vpp+Vtn). Accordingly, the voltage output onto row 112 by the row select unit 104 will typically be about 13–15 volts, which is a volt higher than the Vpp voltage generated by the Vpp pump generator 108. The column select 106 on the other hand, will generally include a latching circuit which outputs a voltage equal to Vpp onto the selected column 114 when the appropriate column address is provided to a gate 110, or other well known circuitry. Also shown is a gate 111 that is connected to the column select 106.

FIG. 1B shows an exemplary storage cell 116 which is defined at an intersection of the row 112 and the column 114 of the memory array 102. In this example, the storage cell 116 includes a pass gate transistor 126, which has one terminal connected to the column 114 and its other terminal connected to the drain and source of a transistor 120. The transistor 120 forms a Fowler/Nordheim tunneling diode, and has a common gate 120a that is coupled to gates of transistor 122 and 124. The special structure of the transistor 120 will be described in greater detail below with reference to FIG. 1D. Transistor 122 is configured to create the necessary electric field to get the appropriate charge onto or off of the storage cell 116, and transistor 124 is generally a sense transistor which enables the determination of whether a logical one or a logical zero is stored in the storage cell 116.

Turning now to FIG. 1C, a semiconductor cross section 130 is shown illustrating a high voltage transistor which is used to steer the necessary high voltage to the storage cell 116. In conventional row select 104 and column select 106 circuitry, such high voltage transistors are needed to withstand the high voltages provided by the Vpp pump generator 108 and to steer them to the storage cell 116. Accordingly, the semiconductor processing operations performed in order to make the high voltage steering transistor will typically include processing operations which are not the same as those needed to make transistors for core ASIC circuitry.

In this example, the high voltage steering transistor is fabricated over a P-type substrate 132. The structure typically includes conventional field oxide 131 to isolate the transistor from others on the semiconductor substrate. Initially, the source and drain regions 134 are doped with a phosphorous (Ph) dopant such that a very deep junction is created. These deep junctions are typically roughly twice the depth of those used for standard low voltage ASIC processing The deeper source and drain junction regions 134 are need in order to raise the junction breakdown level. In addition, high voltage steering transistors will also have a longer channel in order to increase the grounded gate breakdown.

The high voltage steering transistors also require specialized fabrication in order to form thicker gate oxides 138, which are in the range of about 150 angstroms or greater, which are configured to withstand voltages that are as high as 15 volts. This greater thickness of 150 angstroms should be compared to the typical gate oxide thicknesses of about 65 angstroms used in a standard 0.25 micron process within the core of an ASIC. However, because the gate oxide is fabricated to such increased thicknesses, an additional impurity implantation 136 needs to be made in the channel region between the source and drain regions 134. This special implant is usually a boron dopant, which is configured to adjust the voltage threshold of the high voltage steering transistor to compensate for the thicker oxide 138. Also shown is a polysilicon gate 140 which is defined over the thicker oxide 138.

At this point, it should be appreciated that the fabrication of high voltage steering transistors will require the formation of deeper drain source regions 134, an added step to implant the dopant 136 between the drain and source regions 134, and a thicker oxide 138. All of these special fabrication steps are different and in addition to those performed in fabricating standard 0.25 micron transistor devices, and therefore add significantly to the complexity of fabricating memory devices on the same chip along with custom ASIC transistor devices. In addition, the transistors of the ASCI design must be subjected to all of the additional fabrication steps, even when only a relatively small number of memory cells are needed.

FIG. 1D shows a cross sectional view of transistor 120 of FIG. 1B. Transistor 120 also requires special fabrication steps which are different than those performed in making conventional low voltage transistor devices. For example, transistor 120 will generally require the fabrication of source drain regions 142 and a special implant 142a, which connects the source and drain regions 142. For example, if the source and drain regions 142 are N-type regions, the special implant 142a will also be an N-type dopant region. The formation of the special N-type implant region 142a will keep the channel of the storage transistor 120 from turning off when the gate voltage is negative with respect to the drain/source.

The transistor 120 also needs a specially fabricated gate oxide 144, having a thin tunnel oxide region 144a. As is well known, in order to fabricate the thin tunnel oxide region 144a, that portion of the gate oxide needs to be masked off midway through the growth of the oxide 144, and then the masking material must be removed after the gate oxide 144 has been grown to its desired thickness. By using these extra masking steps, the thinner tunnel oxide region 144 can be formed. Once the thinner tunnel oxide region 144a has been formed, a polysilicon gate 120a is formed over the tunnel oxide region 144a. As was the case with the high voltage steering transistor 130, the special transistor 120 also requires processing operations which are different than those required for traditional low voltage transistor devices, which are commonly designed throughout an ASIC design. As a recap, the fabrication of transistor 120 requires a special implant 142a, and a specially fabricated thin tunnel oxide region 144a.

Each of these special fabrication operations needed to make the transistor 120 and the high voltage steering transistors necessarily add to the number of processing operations required to fabricate the transistors in the core of an ASIC device. As is well known, ASIC devices typically have hundreds of thousands or even millions of transistor devices that are fabricated with standard transistor structures. Therefore, if only one non-volatile storage device is fabricated on the same chip along with the ASIC device transistors, the processing complexities of making an ASIC device will unfortunately multiply significantly due to the special fabrication needed to make the memory element devices.

In view of the foregoing, there is a need for a non-volatile memory storage cell that can be fabricated along with core ASIC circuitry without further complicating the process fabrication of standard transistor devices.

SUMMARY OF THE INVENTION

Broadly speaking, the present invention fills these needs by providing a non-volatile memory cell structure, method for making and implementing the non-volatile memory cell that can be designed using transistors fabricated using standard processing, which will reduce processing complexities in memory cell/ASIC integration. It should be appreciated that the present invention can be implemented in numerous ways, including as a process, an apparatus, a system, a device or a method. Several inventive embodiments of the present invention are described below.

In one embodiment, a non-volatile storage element that is defined between a bitline and a complementary bitline, and that can be accessed by a selected wordline is disclosed. The non-volatile storage element includes a high voltage latch that is configured to receive a pump voltage, and a reference voltage that is about half of the pump voltage. The non-volatile storage element also includes a storage cell that is configured to receive a logical programming value from the bitline and the complementary bit line when the wordline is driven high to turn on a first passgate and a second passgate. The storage cell further includes a capacitive transistor having its back gate, source and drain coupled to a first terminal of the first passgate, and a tunneling transistor having its back gate, source and drain coupled to a second terminal of the second passgate. The capacitive transistor and the tunneling transistor are configured to share a floating gate. When one or more of the above described non-volatile storage elements are defined in a custom application specific integrated circuit (ASIC) having a multiplicity of transistors, each of the transistors in the storage element may be formed using about the same fabrication process operations as used to fabricate the multiplicity of transistors of the ASIC.

In another embodiment, a method for implementing a non-volatile storage element that is defined at the intersection of a pair bitlines and a wordline is disclosed. The method includes fixing a set of initial conditions to set up a programming of a logical 1 or a logical 0. The fixing of the set of initial conditions includes: (a) setting a pump voltage at Vdd; (b) setting a reference voltage at ground; (c) setting the wordline at Vdd; (d) setting a control ground (CGND) at Vdd; (e) setting a bitline at Vdd; and (f) setting a complementary bitline at ground. The method further including raising the pump voltage to a programming voltage level which causes the reference voltage to rise to about half of the programming voltage level, and tunneling electrons through a tunneling transistor defined in an N-well. The tunneling transistor has a source, a drain and a back gate that are tied together, and the electrons are configured to tunnel into the N-well when programming the logical 0 and otherwise are configured to tunnel out of the N-well and onto a floating gate of the tunneling transistor when programming the logical 1.

In yet another embodiment, a storage element that is defined between a bitline and a complementary bitline and can be accessed by a selected wordline is disclosed. The storage element includes a high voltage latching means that is configured to receive a pump voltage, and a reference voltage that is about half of the pump voltage. The high voltage latch includes a high voltage regenerative latch and a pair of cascode transistors. The storage element further includes a storage cell means that has a capacitive transistor with its back gate, source and drain coupled to a first terminal of a first passgate that is coupled to the wordline. In addition, the storage cell means has a tunneling transistor with its back gate, source and drain coupled to a second terminal of a second passgate that is coupled to the wordline, and the capacitive transistor and the tunneling transistor share a floating gate. In this embodiment, one or more of the above described storage element can be defined in a custom application specific integrated circuit (ASIC) having a multiplicity of transistors, and each of the multiplicity of transistors of the ASIC have about the same standard transistor structure as each of the transistors in the storage element.

One advantage of the present invention is that the same standard processing used to fabricate transistor devices in the core circuitry of an integrated circuit design can be used to fabricate memory storage devices. As a result, when only a relatively small amount of storage cells are needed in some sort of application specific circuit, the integration of the storage cells will no longer necessitate complicating the fabrication process in order to form special high voltage transistors and special tunneling transistors, having specialized tunnel oxides. This therefore makes the integration of storage cells into any standard circuit design less expensive and more efficient. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

FIG. 1A shows an example of a non-volatile storage memory, including a memory array that has a plurality of rows and columns.

FIG. 1B shows an exemplary storage cell that is defined at an intersection of a row and a column of a memory array.

FIG. 1C shows a cross sectional view of a high voltage transistor that is formed using special processing operations.

FIG. 1D shows a cross sectional view of a conventional tunneling transistor of FIG 1B.

FIG. 2 shows a block diagram of a non-volatile storage cell in accordance with one embodiment of the present invention.

FIG. 3A shows a more detailed circuit diagram of the high voltage latch of FIG. 2 in accordance with one embodiment of the present invention.

FIG. 3B shows a cross sectional view of transistors that make up a high voltage regenerative latch in accordance with one embodiment of the present invention.

FIG. 3C shows a similar transistor structure as shown in FIG. 3B, which make up cascode transistors in accordance with one embodiment of the present invention.

FIG. 4A shows a more detailed circuit diagram of a storage cell of FIG. 2 in accordance with one embodiment of the present invention.

FIGS. 4B and 4C show more detailed diagrams of a Fowler/Nordheim tunneling diode, in accordance with one embodiment of the present invention.

DETAILED DESCRIPTION OF THE PREFERRED EMBODIMENTS

The present invention provides a non-volatile memory cell structure that is designed using transistors that are fabricated using standard processing in order to reduce processing complexities in memory cell/ASIC integration. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 2 shows a simplified block diagram of a non-volatile storage cell 200 in accordance with one embodiment of the present invention. The non-volatile storage cell 200 includes a high voltage latch 204 and a storage cell 202 which are oriented between a bitline (BL) and a complimentary bitline (/BL). The bitline (BL) is coupled to a passgate transistor 206 and the complimentary bitline (/BL) is coupled to a passgate 208. The gates of passgates 206 and 208 are each connected to a wordline (WL). The high voltage latch 204 is configured to receive high voltage signals 218 and 220 from a VPP pump voltage and a PREF voltage, respectively. The high voltage latch 204 is also configured to couple up to the storage cell 202 via signals 212 and 210. The storage cell 202 is shown connected to a CGND signal, which couples up to the storage cell via a signal 222.

FIG. 3A shows a more detailed circuit diagram of the high voltage latch 204 in accordance with one embodiment of the present invention. Signals 210 and 212 are respectively shown connected within the storage cell 202 at nodes 238 and 236. The VPP pump voltage is shown connected via signal 218 at a node 219. Node 219 is thus connected to a source terminal of a transistor 224 and its respective back gate. Node 219 is also connected to the source of a transistor 226 and the back gate of that transistor. In this embodiment, transistors 224 and 226 are preferably P-type transistors formed in an N-well of a P-type substrate. The gate of transistor 224 is connected to a node 232 that defines the drain of transistor 226, and the gate of transistor 226 is coupled to a node 234 that defines the drain of transistor 224. Transistors 224 and 226 therefore define a high voltage regenerative latch, and because the P-type transistors are formed in N-wells; the field created by the high voltage will be dropped across the N-well/P-type substrate junction, which has a higher breakdown voltage than the source/drain to substrate junction.

Transistors 228 and 230 of the high voltage latch 204 form a cascode transistor arrangement that is configured to limit the voltage across the gate oxides of transistors 224 and 226. Therefore, the cascode transistors 228 and 230 are, in this embodiment, well suited to protect the integrity of the N-well transistors 224 and 226 when a high voltage is provided by the VPP pump voltage through signal 218.

PREF voltage is also shown provided via a signal 220 to a node 220'. Node 220' defines the gate electrode of transistors 228 and 230. A terminal of transistor 228 is connected to node 234, and node 234 is also connected to the backside gate of transistor 228. Similarly, a terminal of transistor 230 is connected to a node 232 which is also coupled to the back gate of transistor 230. Node 238 is thus connected via signal line 210 to a terminal of transistor 230, and node 236 is connected to a terminal of transistor 228 via signal 212.

To illustrate the functionality of the high voltage latch 204, the following example is provided of when programming a logical 1 is desired. After an initial setup, a VPP pump voltage of about 8 volts is provided to signal line 218. About 8 volts is selected because the breakdown voltage of transistors 240 and 242 will be about 6.5 volts, and a voltage higher than about 6.5 volts will be required to achieve breakdown. In standard 0.25 micron transistor processing, the typical gate oxide thickness is about 65 angstroms. Because for every 10 angstroms of gate oxide 1 volt will be needed to achieve breakdown, about 6.5 volts will be needed to achieve breakdown in transistors having 65 angstroms of gate oxide.

When the about 8 volts is provided by the VPP pump voltage, PREF will provide signal line 220 and node 220' about half of the VPP pump voltage. In this embodiment, about 4 volts is provided to the node 220' when VPP is about 8 volts. Accordingly, PREF will approximately track the VPP pump voltage at about half the voltage magnitude. When PREF provides about 4 volts on line 220 to node 220', transistors 228 and 230, which are P-type transistors, will only pull down as far as their gate voltage plus a $V_t$ before they turn off. In this manner, when about 8 volts is provided to node 219, about 8 volts will be provided at node 234, while 4.8 volts is provided at node 232. Therefore, as mentioned above, the cascode transistors 228 and 230 will function to limit the voltage that is provided across the gate oxide of transistor 224 during the programming of a logical 1, and the gate oxide of transistor 226 during the programming of a logical 0. A more complete description of the programming of logical 1's and logical 0's will be provided below in sections A and B.

FIG. 3B shows a cross sectional view of transistors 224 and 226 which make up the high voltage regenerative latch in accordance with one embodiment of the present invention. As shown, transistors 224 and 226 are fabricated as P-type transistors over an N-well 302. In general, diffusion regions 304 define the P-type impurities of the source and drains of the transistor device. An N+ diffusion region 306 is used to define a contact down to the back gate of the respective transistors, which are shown connected to node 219 in FIG. 3A. It is important to note that transistors 224 and 226 are formed using standard gate oxides 308, which are fabricated at the same time the gate oxides of other core ASIC transistor are formed. Also shown is a polysilicon gate 310 which is patterned over the gate oxide 308.

FIG. 3C shows a similar transistor structure for the P-type transistors 228 and 230 that form the cascode transistor arrangement in FIG. 3A. The polysilicon gate 310 in this example, is shown connected to node 220', and the back gate that is connected to the N+ diffusion region 306 is also connected to nodes 232 and 234, respectively.

FIG. 4A shows a more detailed circuit diagram of the storage cell 202 of FIG. 2 in accordance with one embodiment of the present invention. Node 236 is shown connected to a terminal of the passgate 206, and node 238 is connected to a terminal of the passgate 208. Transistors 240 and 242 are shown wired in an arrangement where their drain and sources are connected respectively to the back gate. In this manner, node 236 is connected to the source, drain, and back gate of transistor 240, and node 238 is connected to the source, drain, and back gate of transistor 242. A floating gate terminal (FGT) 256 defines the gate electrode (i.e., a single polysilicon line) of transistors 240, 242, and a transistor 248.

Also provided are N-type transistors 244 and 246, which have their terminals connected between nodes 236 and node 252, and node 238 and node 254, respectively. The gates of transistors 244 and 246 are shown connected to a VDD voltage, which may be about 2.5 volts. In an alternative embodiment, a voltage that is VDD plus a $V_{PN}$ may be provided to enhance the voltage breakdown of transistors 244 and 246. Node 252 is shown connected to a gate terminal of transistor 250, and signal line 222 that is connected to CGND and is connected to a terminal of transistor 248 and transistor 250. In this embodiment, transistor 240 will primarily function as a capacitor, and transistor 242 will function as a Fowler/Nordheim tunneling diode.

A. EXAMPLE OF PROGRAMMING A LOGICAL ONE

When programming a logical 1 into the non-volatile storage cell 200 is desired, the cell has to be provided with initial conditions. The initial conditions include placing the VPP pump voltage equal to VDD, placing PREF equal to zero, driving the wordline (WL) HIGH, placing the CGND to a logical 1 (i.e., VDD), driving the bitline with a low voltage input equal to VDD, and driving the complementary bitline with a low voltage input equal to 0 (logical LOW). Because the wordline is driven HIGH, the passgates 206 and 208 will conduct the voltage levels provided by the bitlines to nodes 236 and 238. Accordingly, node 236 will be set to about VDD, and node 238 will be set to a logical 0 (i.e., ground).

Because PREF at node 220' is now set at a logical 0, both transistors 228 and 230 will be ON, and the logical state present at nodes 236 and 238 as shown in FIG. 3A will be provided to nodes 234 and 232, respectively. When a logical 1 is provided to node 234, transistor 226 will be turned OFF, and when a logical 0 is provided at node 232, transistor 224 will be turned ON. At this point, data will be written into the high voltage latch 204 and the latch will be set.

Once the data has been written into the high voltage latch and the data has been steered from the bitlines into the non-volatile storage cell 200, VPP pump voltage will be increased from about VDD (e.g., 2.5 volts) to about 8 volts. In this embodiment, PREF will follow the increase in voltage from about zero volts to about half of VDD, thereby pumping PREF to about 4 volts. At this point, node 236 will be pulled up to about 8 volts to match VPP pump voltage because transistors 224 and 228 are both ON. However, node 238 will remain at ground because transistor 226 is OFF.

Referring again to FIG. 4A, tunneling will now begin to occur through the gate oxide of transistor 242. Tunneling occurs because transistor 240, which acts as a capacitor tries to pull up the floating gate terminal (FGT) 256 as node 236 increases to about 8 volts. More specifically, when a difference of about 6.5 volts is provided between node 238 and the floating gate terminal 256, electrons (é) will begin to tunnel through the gate oxide of transistor 242 from node 238 onto the floating gate terminal 256. As shown in the cross section of FIG. 4C, the floating gate terminal 256 will be positive with respect to the source and drain which are connected to node 238. Therefore, as pictorially shown, the electrons (é) will begin to tunnel from the channel between the source and drain of transistor 242 through the gate oxide 308 and onto the floating gate terminal 256.

When electrons start to tunnel through the gate oxide of transistor 242 and onto the gate terminal 256, the gate of transistor 248 will also begin to be negatively charged with respect to node 236. At this point, transistor 248 is still on, and CGND will still be at VDD, and therefore current will not flow to ground. As node 236 is pumped up to about 8 volts, the floating gate terminal 256 will be charged to about 4 volts, thereby producing about negative 4 volts across transistor 240, which acts as a capacitor In general, the floating gate is being charged negatively because electrons are tunneling through transistor 242 and onto the floating gate terminal 256.

After about 20 milliseconds (or ranging between 1 ms and 40 ms), VPP pump voltage is brought down from about 8 volts back to VDD, which is about 2.5 volts. PREF will therefore follow the lowering of the voltage down to about zero, thereby bringing node 236 down to about 2.5 volts. At this point, the floating gate terminal 256 will fall to a voltage ranging between about −0.5 volts and about −1.5 volts. Now, transistor 248 will be turned OFF and CGND will be pulled down to ground, thereby keeping node 252 HIGH, at about VDD minus a threshold voltage of transistor 244. When node 252 is HIGH, transistor 250 will be turned ON, thereby holding node 238 at ground. Once node 238 is held at ground, the wordline (WL) is set back to LOW, and the logical 1 data that was programmed will remain stored.

B. EXAMPLE OF PROGRAMMING A LOGICAL ZERO

When programming a logical 0 is desired, the initial conditions are first set. Therefore, CGND is set to a logical 1 (i.e., VDD), VPP pump voltage is set to about VDD, PREF is set to a logical 0, the wordline (WL) is driven HIGH, the bitline (BL) is provided with a logical 0, and the complimentary bitline (/BL) is provided with a logical 1 (i.e., VDD).

With reference to FIG. 3A, the low voltage input provided by the bitlines is steered into the high voltage latch 204, which places a logical 1 on node 232, and a logical 0 on node 234. At this point, transistor 226 will be ON and transistor 324 will be OFF, and the high voltage latch will be set. Now, VPP pump voltage will be raised to about 8 volts and PREF will track up to about half, thereby raising PREF up to about 4 volts. Now, node 236 will be set to zero, while node 238 will be driven to about 8 volts.

Reference is now drawn to FIG. 4A where about 8 volts is provided at node 238 and about 0 volts is provided at node 236, which will cause electrons to tunnel from the floating gate terminal 256 through the gate oxide 308 of transistor 242, and flow toward node 238. The flow of electrons from the floating gate terminal 256 to the node 238 is pictorially shown in FIG. 4B. More specifically, as soon as about 6.5 volts is detected across the tunneling transistor 242 between node 238 and the floating gate terminal 256, electrons will begin to tunnel across the gate oxide of transistor 242 from the floating gate terminal 256, and leading to node 238. As electrons are pulled off of the floating gate terminal 256, the floating gate terminal 256 will become positively charged up to about +4 volts.

Now, there will be a positive 4 volt difference across the capacitive transistor 240 between nodes 236 and the floating gate terminal 256. After about 20 milliseconds, the VPP pump voltage will be brought down from about 8 volts down to VDD (about 2.5 volts), and PREF will track VPP pump voltage down to about ground. In addition CGND will be brought down from a logical HIGH state to a logical LOW, thereby placing it at ground. Also, node 238 will be brought down from about 8 volts down to about VDD (2.5 volts). Because the floating gate terminal 256 is charged positively, transistor 248 will be turned ON, and node 252 will be held at ground, which turns OFF transistor 250. When transistor 250 is turned OFF, node 238 will stay at about VDD. At this point, the wordline can be switched back to a logical LOW and the logical 0 data will remain stored in the non-volatile storage cell.

C. EXAMPLES OF PERFORMING READ OPERATIONS

During a READ operation, the non-volatile storage cell 200 will operate as a typical SRAM cell. Accordingly, to initiate a READ operation of data that may be stored in the non-volatile storage cell 200, VPP pump voltage will be set to about VDD, PREF will be set to about 0, CGND will be set to about 0, and the wordline will be driven HIGH. Once these conditions are set, the bitlines may be sensed to determine what data is stored in the cell.

For example, if a logical 1 is stored in the cell, node 238 will be LOW thereby pulling down the complimentary bitline (/BL), and the node 236 will be HIGH which pulls up the bitline (BL). Once this voltage differential is sensed between BL and /BL, an appropriate memory sense amplifier may be used to sense the logical 1 data stored in the cell.

Similarly, if a logical 0 is stored in the cell, node 238 will be HIGH, which will pull up the complimentary bitline (/BL). At the same time, node 236 will be LOW, which will pull down the bitline (BL). Now, a sense amplifier may sense the difference between /BL and BL to sense that logical 0 data is stored in the cell.

In an additional embodiment, the non-volatile storage cell 200 may also operate as a shadow RAM. As is well known to those skilled in the art, a shadow RAM operates like an SRAM during reading and writing operations, but will also be capable of storing the data when the cell is turned OFF. Essentially, a shadow RAM is like an SRAM with an EEPROM cell behind it.

D. CONCLUSION

Although the foregoing invention has been described in some detail for purposes of clarity of understanding, it will be apparent that certain changes and modifications may be practiced within the scope of the appended claims. For example, although the memory cell was described herein as being a generic non-volatile storage element, this storage element may also be classified as an EEPROM cell, a Flash Memory cell, and a shadow RAM cell, etc. In addition, even though the embodiments of the present invention have been described for 0.25 micron technology devices, the inventive features may be scaleable to any micron technology device generation. Accordingly, the present embodiments are to be considered as illustrative and not restrictive, and the invention is not to be limited to the details given herein, but may be modified within the scope and equivalents of the appended claims.

What is claimed is:

1. A non-volatile storage element defined between a bitline and a complementary bitline, the non-volatile storage element being accessed by a selected wordline, the non-volatile storage element comprising:

a high voltage latch configured to receive a pump voltage and a reference voltage that is about half of the pump voltage; and a storage cell configured to receive a logical programming value from the bitline and the complementary bit line when the wordline is driven high to turn on a first passgate and a second passgate, the storage cell further including a capacitive transistor having its back gate, source and drain connected to a first terminal of the first passgate, and a tunneling transistor having its back gate, source and drain connected to a second terminal of the second passgate, and the capacitive transistor and the tunneling transistor share a floating gate.

2. A non-volatile storage element as recited in claim 1, wherein the high voltage latch includes a high voltage regenerative latch.

3. A non-volatile storage element as recited in claim 2, wherein the high voltage latch includes a pair of cascode transistors.

4. A non-volatile storage element as recited in claim 3, wherein the high voltage regenerative latch is configured to receive the pump voltage, and a common gate of the pair of cascode transistors is configured to receive the reference voltage.

5. A non-volatile storage element as recited in claim 4, wherein the pair of cascode transistors are configured to reduce the pump voltage across transistor gates of the high voltage regenerative latch.

6. A non-volatile storage element as recited in claim 3, wherein the pair of cascode transistors and a pair of transistors of the high voltage regenerative latch are P-type transistors that are defined in an N-well.

7. A non-volatile storage element as recited in claim 1, wherein the tunneling transistor is defined in an N-well, and electrons tunnel into the N-well when the floating gate is negative with respect to the source and drain of the tunneling transistor.

8. A non-volatile storage element as recited in claim 1, wherein the tunneling transistor is defined in an N-well, and electrons tunnel out of a source/drain and onto the floating gate when the floating gate is positive with respect to the source and drain of the tunneling transistor.

9. A non-volatile storage element as recited in claim 1, wherein each transistor of the high voltage latch and storage cell of the non-volatile storage element have a standard transistor structure, including about equal gate oxides and diffusion regions.

10. A non-volatile storage element as recited in claim 9, wherein one or more of the non-volatile storage element are defined in a custom application specific integrated circuit (ASIC) having a multiplicity of transistors, and each of the multiplicity of transistors of the ASIC have about the same standard transistor structure of each of the transistors in the non-volatile storage element.

11. A non-volatile storage element as recited in claim 1, wherein the non-volatile storage element is a memory cell selected from the group of an EEPROM cell, a Flash Memory cell, and a shadow RAM cell.

12. A method for implementing a non-volatile storage element that is defined at a pair bitlines and a wordline, the method comprising:

fixing a set of initial conditions to set up a programming of a logical 1 or a logical 0, the fixing of the set of initial conditions including;
setting a pump voltage at Vdd;
setting a reference voltage at ground;
setting the wordline at Vdd;
setting a control ground (CGND) at Vdd;
setting a bitline at Vdd; and
setting a complementary bitline at ground;

raising the pump voltage to a programming voltage level which causes the reference voltage to rise to about half of the programming voltage level; and tunneling electrons through a tunneling transistor defined in an N-well, the tunneling transistor having a source, a drain and a back gate that are tied together, the electrons being configured to tunnel into the N-well when programming the logical 0 and otherwise configured to tunnel out of the N-well and onto a floating gate of the tunneling transistor when programming the logical 1.

13. A method for implementing a non-volatile storage element as recited in claim 12, further comprising:

decreasing the pump voltage from the programming voltage level to Vdd, thereby causing the reference voltage to decrease to about ground.

14. A method for implementing a non-volatile storage element as recited in claim 13, wherein the decreasing is performed after between about 1 millisecond and about 40 milliseconds passes from the beginning of the raising of the pump voltage to the programming voltage level.

15. A method for implementing a non-volatile storage element as recited in claim 14, further comprising:

connecting a capacitive transistor between one of the bitlines and the tunneling transistor, wherein the floating gate of the tunneling transistor defines a gate of the capacitive transistor.

16. A method for implementing a non-volatile storage element as recited in claim 14, wherein each transistor of the non-volatile storage element is fabricated using a standard transistor formation process, the standard formation process being configured to form about equal gate oxides for each of the transistors.

17. A method for implementing a non-volatile storage element as recited in claim 14, further comprising:

integrating the non-volatile storage element into a custom application specific integrated circuit (ASIC) having a multiplicity of transistors, and each of the multiplicity of transistors of the ASIC being formed using about the same standard transistor formation process as used to form each of the transistors in the non-volatile storage element.

18. A storage element defined between a bitline and a complementary bitline, the storage element being accessed by selected a wordline, the storage element comprising:

a high voltage latching means configured to receive a pump voltage and a reference voltage that is about half of the pump voltage, the high voltage latch includes a high voltage regenerative latch and a pair of cascode transistors; and a storage cell means including a capacitive transistor having its back gate, source and drain connected to a first terminal of a first passgate that is connected to the wordline, and a tunneling transistor having its back gate, source and drain connected to a second terminal of a second passgate that is connected to the wordline, and the capacitive transistor and the tunneling transistor share a floating gate.

19. A storage element as recited in claim 18, wherein the high voltage regenerative latch is configured to receive the pump voltage, and a common gate of the pair of cascode transistors is configured to receive the reference voltage.

20. A storage element as recited in claim 19, wherein the pair of cascode transistors are configured to reduce the pump voltage across transistor gates of the high voltage regenerative latch.

21. A storage element as recited in claim 20, wherein the pair of cascode transistors and a pair of transistors of the high voltage regenerative latch are P-type transistors that are defined in an N-well.

22. A storage element as recited in claim 18, wherein the tunneling transistor is defined in an N-well, and electrons tunnel into the N-well when the floating gate is negative with respect to the source and drain of the tunneling transistor.

23. A storage element as recited in claim 18, wherein the tunneling transistor is defined in an N-well, and electrons tunnel out of a source/drain and onto the floating gate when the floating gate is positive with respect to the source and drain of the tunneling transistor.

24. A storage element as recited in claim 18, wherein each transistor of the high voltage latching means and storage cell means of the storage element have a standard transistor structure, including about equal gate oxides and diffusion regions.

25. A storage element as recited in claim 24, wherein one or more of the storage element are defined in a custom application specific integrated circuit (ASIC) having a multiplicity of transistors, and each of the multiplicity of transistors of the ASIC have about the same standard transistor structure of each of the transistors in the storage element.

26. A storage element as recited in claim 18, wherein the storage element is a memory cell selected from the group of an EEPROM cell, a Flash Memory cell, and a shadow RAM cell.

* * * * *